United States Patent [19]

Watanabe et al.

[11] Patent Number: 5,624,787
[45] Date of Patent: Apr. 29, 1997

[54] CHEMICALLY AMPLIFIED POSITIVE RESIST COMPOSITION

[75] Inventors: Satoshi Watanabe; Katsuyuki Oikawa; Toshinobu Ishihara, all of Niigata-ken; Akinobu Tanaka, Tokyo; Tadahito Matsuda, Tokyo; Yoshio Kawai, Tokyo, all of Japan

[73] Assignees: Shin-Etsu Chemical Co., Ltd.; Nippon Telegraph and Telephone Corp., both of Tokyo, Japan

[21] Appl. No.: 466,690

[22] Filed: Jun. 6, 1995

[30] Foreign Application Priority Data

Jun. 10, 1994 [JP] Japan ..................... 6-152655

[51] Int. Cl.$^6$ ..................... G03F 7/039
[52] U.S. Cl. ..................... 430/270.1; 430/914; 430/921; 522/15; 522/31
[58] Field of Search ..................... 430/281, 270, 430/914, 921, 281.1, 270.1; 522/15, 31

[56] References Cited

U.S. PATENT DOCUMENTS

| 4,108,747 | 8/1978 | Crivello | 430/281 |
| 4,603,101 | 7/1986 | Crivello | 430/270 |
| 5,220,037 | 6/1993 | Schwalm et al. | 549/78 |
| 5,346,803 | 9/1994 | Crivello | 430/270 |

FOREIGN PATENT DOCUMENTS

| 615163 | 9/1994 | European Pat. Off. | 430/270 |

OTHER PUBLICATIONS

Kawai et al, from Compendex Database, Abstract in reference to Proceedings of 7th International MicroProcess Conference (MPC'94), in Hsin Shu, Taiwan, Jul. 11, 1994 thro Jul. 14, 1994 and Japanese Journal of Applied Physics, Part 1: vol. 33, n 12 B Dec. 1994, pp. 7023–7027.

Reichmanis et al (eds), *Polymers in Lithograpy*, Chapter 5, American Chemical Society, 1989, pp. 74–85.

*Primary Examiner*—Cynthia Hamilton
*Attorney, Agent, or Firm*—Millen, White, Zelano, & Branigan, P.C.

[57] ABSTRACT

A chemically amplified, positive resist composition contains a trifluoromethanesulfonic or p-toluenesulfonic acid bis- or tris(p-tert-butoxyphenyl)sulfonium salt and a nitrogenous compound. The composition is highly sensitive to high energy radiation, especially KrF excimer laser and has high sensitivity, resolution and plasma etching resistance while the resulting resist pattern is heat resistant.

22 Claims, No Drawings

CHEMICALLY AMPLIFIED POSITIVE RESIST COMPOSITION

BACKGROUND OF THE INVENTION

1. Field of the Invention

This invention relates to a novel sulfonium salt and a chemically amplified, positive resist composition containing the same. The chemically amplified, positive resist composition is highly sensitive to high energy radiation such as deep-ultraviolet lights, electron beams and X-rays, can be developed with alkaline aqueous solution to form a pattern, and is thus suitable for use in a fine patterning technique.

2. Prior Art

As the LSI technology tends toward higher integration and higher speed, further refinement of pattern rules is required. The current patterning technology mostly relies on light exposure which is now approaching to the essential limit of resolution which is dictated by the wavelength of a light source. It is generally recognized that in light exposure using g-line (wavelength 436 nm) or i-line (wavelength 365 nm) as a light source, a pattern rule of about 0.5 μm is the limit. For LSIs fabricated by such light exposure technique, a degree of integration equivalent to 16 mega-bit DRAM is the limit. At present, LSIs fabricated in the laboratory have reached this stage. It is urgently required to develop a finer patterning technique.

Under such circumstances, deep-ultraviolet lithography is regarded promising as the next generation of fine patterning technology. The deep-UV lithography is capable of working on the order of 0.3 to 0.4 μm. If a less light absorbing resist is used, it is possible to form a pattern having a side wall nearly perpendicular to the substrate. Great attention is now paid to the technique of utilizing a high illuminance KrF excimer laser as a deep-UV light source. In order to employ this technique on a mass production scale, a resist material having low light absorption and high sensitivity is desired.

From this point of view, a number of chemically amplified, positive working resist materials were recently developed using acid catalysts as disclosed in JP-B 27660/1990, JP-A 27829/1988, U.S. Pat. No. 4,491,628 and 5,310,619. These materials have high sensitivity, resolution and dry etching resistance and are promising as resist materials especially suited for deep-UV lithography.

It is known that the function of chemically amplified, positive resist materials is largely affected by photo-acid generators used therein. Typical photo-acid generators are onium salts as shown below.

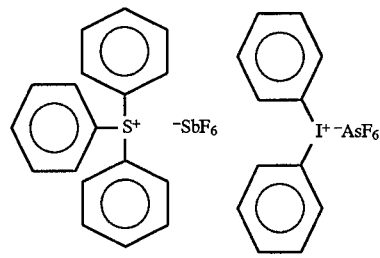

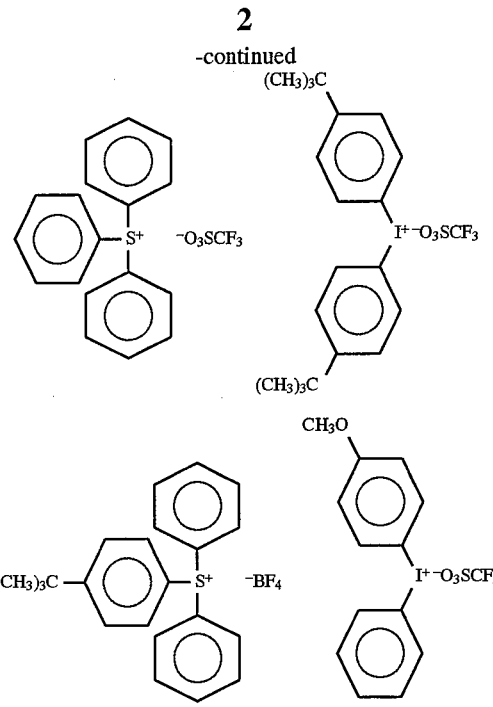

The onium salts themselves are oil soluble. When blended as a resist component, they act to reduce the solubility of the resist material in alkaline aqueous solution and to prevent the resist film from thinning upon development.

However, in exposed areas of positive resist material, photo-acid generators absorb high energy rays to decompose into products which are also oil soluble. This reduces the rate of dissolution of the exposed areas in alkaline aqueous solution, failing to provide a high ratio of the alkali dissolution rate of exposed areas to that of unexposed areas (which ratio is known as dissolution contrast). Consequently, chemically amplified, positive resists using onium salts as mentioned above are low in resolution upon alkaline development, that is, poor in removal of exposed areas.

Prior art chemically amplified, positive resists, however, suffer from the problem known as post-exposure delay (PED) that when deep-UV, electron ray or X-ray lithography is carried out, line patterns would have a T-top configuration, that is, patterns become thick at the top if the leave-to-stand or delay time from exposure to post-exposure baking (PEB) is extended. This problem, which arises probably because the resist surface is reduced in solubility, becomes a serious drawback on practical application. This not only makes difficult dimensional control in the lithographic process, but also adversely affects dimensional control in the processing of substrates using dry etching. In this regard, reference is made to W. Hinsberg et al., J. Photopolym. Sci. Technol., 6 (4), 535–546 (1993) and T. Kumada et al., J. Photopolym., Sci. technol., 6 (4), 571–574 (1993). There are available no chemically amplified, positive resists which can resolve this problem and are thus practically acceptable.

It is understood that basic compounds in the air largely participate in the PED problem associated with chemically amplified, positive resists. Light exposure generates acids at the resist surface which react with basic compounds in the air and are thereby deactivated. As the delay time until PEB is extended, more amounts of acids are deactivated and accordingly, decomposition of acid unstable groups are more unlikely to occur. As a consequence, an insolubilized layer is formed at the resist surface, resulting in a T-top configured pattern.

It is known from JP-A 232706/1993 and 249683/1993 that since addition of a basic compound suppresses the influence of basic compounds in the air, it is also effective for resolving the PED problem. However, the basic compound used therein is little taken into the resist film due to volatilization, less compatible with resist components, and unevenly dispersible in a resist film over its width. Thus the basic compound cannot achieve its advantages in a reproducible manner and causes a drop of resolving power.

SUMMARY OF THE INVENTION

Therefore, an object of the present invention is to provide a chemically amplified, positive resist composition which has solved the problem of a surface insoluble layer which causes T-top configuration and has sufficiently high sensitivity and resolution to comply with a fine patterning technique.

We have found that by using a sulfonium salt whose aromatic groups have substituted thereon at least two acid unstable groups or tert-butoxy groups as represented by the general formula (1) in combination with a nitrogenous compound, there is obtained a chemically amplified, positive resist composition which has sufficiently high resolution to comply with a fine patterning technique. The composition is most effective when combined with deep-UV lithography.

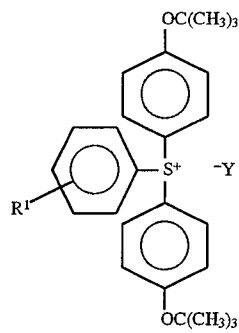
(1)

In formula (1), $R^1$ is a hydrogen atom, alkyl group or alkoxy group and Y is trifluoromethanesulfonate or p-toluenesulfonate.

Therefore, in one embodiment, the present invention provides a chemically amplified, positive resist composition comprising a sulfonium salt of formula (1) and a nitrogenous compound.

In another embodiment, a chemically amplified, positive resist composition includes (A) an organic solvent, (B) an alkali soluble resin, (C) a dissolution inhibitor having an acid unstable group, (D) a sulfonium salt of formula (1), (E) an photo-acid generator or an onium salt, and (F) a nitrogenous compound. In other embodiments, the chemically amplified, positive resist composition includes components (A), (B), (C), (D), and (F), or components (A), (B), (D), and (F), or components (A), (B), (D), (E), and (F).

The resist composition containing a sulfonium salt of formula (1) and a nitrogenous compound has several advantages. Due to the effect of acid unstable groups in the sulfonium salt of formula (1), the resist composition has an enhanced dissolution contrast. Although the sulfonium salt of formula (1) itself is low soluble in alkali, it is decomposed to generate an acid upon exposure to high energy. By the action of this acid as well as post-exposure baking (PEB), tert-butoxy groups are efficiently decomposed to form a phenol derivative having high alkali solubility, which leads to an enhanced dissolution contrast. Additionally, the nitrogenous compound has the function of minimizing the influence of deactivation of an acid at a resist surface by basic compounds in air. Then the resulting chemically amplified, positive resist composition can overcome the problem of a surface insoluble layer which causes T-top configuration, that is, the problem of PED and offers sufficiently high resolution and PED stability to lend itself to fine patterning.

DETAILED DESCRIPTION OF THE INVENTION

According to the present invention, a chemically amplified, positive working resist composition contains a sulfonium salt of formula (1) and a nitrogenous compound. The composition may be a two component chemically amplified, positive resist composition (alkali soluble resin/photo-acid generator) or a three component chemically amplified, positive resist composition (alkali soluble resin/photo-acid generator/dissolution inhibitor), with the three component chemically amplified, positive resist composition being preferred.

Preferably the resist composition is comprised of, in parts by weight, (A) about 150 to 700 parts, more preferably 250 to 500 parts of an organic solvent, (B) about 70 to 90 parts, more preferably 75 to 85 parts of an alkali soluble resin, (C) about 5 to 40 parts, more preferably 10 to 25 parts of a dissolution inhibitor having an acid unstable group, in the case of the three component system, (D) about 1 to 15 parts, more preferably 2 to 8 parts of a sulfonium salt of formula (1), (E) about 0.5 to 15 parts, more preferably 2 to 8 parts of another photo-acid generator, if necessary, and (F) about 0.05 to 4 parts, more preferably 0.1 to 1 part of a nitrogenous compound.

The composition of the invention is characterized by the combined use of components (D) and (F).

Examples of organic solvent (A) include ketones such as cyclohexanone and methyl-2-n-amylketone; alcohols such as 3-methoxybutanol, 3-methyl-3-methoxybutanol, 1-methoxy-2-propanol and 1-ethoxy-2-propanol; ethers such as propylene glycol monomethyl ether, ethylene glycol monomethyl ether, propylene glycol monoethyl ether, ethylene glycol monoethyl ether, propylene glycol dimethyl ether, and diethylene glycol dimethyl ether; and esters such as propylene glycol monomethyl ether acetate, propylene glycol monoethyl ether acetate, ethyl lactate, ethyl pyruvate, butyl acetate, methyl 3-methoxypropionate and ethyl 3-ethoxypropionate, alone or in admixture of two or more. The most preferred solvent is 1-ethoxy-2-propanol because the photo-acid generator of the resist composition is most soluble therein.

Examples of alkali soluble resin (B) include polyhydroxystyrene and derivatives thereof. Preferred are those polyhydroxystyrene derivatives wherein hydrogen atoms of some OH groups of polyhydroxystyrene are replaced by acid unstable groups. Preferred examples of the acid unstable group used therein include tert-butyl, tert-butoxycarbonyl, and tetrahydropyranyl groups. The polyhydroxystyrene and derivatives thereof should preferably have a weight average molecular weight of about 5,000 to about 100,000.

Dissolution inhibitor (C) should have at least one group which is decomposable with an acid (acid unstable group) in a molecule and may be either a low molecular weight compound or a polymer. Any of well-known dissolution inhibitors may be used. Exemplary low molecular weight compounds include bisphenol A derivatives having an acid unstable group and carbonate derivatives having an acid unstable group, with those bisphenol A derivatives wherein OH groups of bisphenol A are replaced by t-butoxy or butoxycarbonyloxy groups being preferred. Examples of the polymeric dissolution inhibitor include copolymers of p-butoxystyrene and t-butyl acrylate, and copolymers of p-butoxystyrene and maleic anhydride, with those copolymers having a weight average molecular weight of about 500 to about 10,000 being preferred.

Sulfonium salt (D) has the general formula (1).

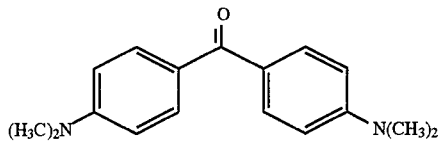

In formula (1), $R^1$ is a hydrogen atom, alkyl group or alkoxy group. Exemplary preferred alkyl groups are those having 1 to 8 carbon atoms, including methyl, ethyl, propyl, isopropyl, n-butyl, sec-butyl, tert-butyl, hexyl, and cyclohexyl groups, with the methyl, ethyl, isopropyl, and tert-butyl groups being especially preferred. Exemplary preferred alkoxy groups are those having 1 to 8 carbon atoms, including methoxy, ethoxy, propoxy, isopropoxy, n-butoxy, sec-butoxy, tert-butoxy, hexyloxy, and cyclohexyloxy groups, with the methoxy, ethoxy, isopropoxy and tert-butoxy groups being especially preferred. Y is trifluoromethanesulfonate or p-toluenesulfonate.

Several illustrative, non-limiting examples of the sulfonium salt include trifluoromethanesulfonic acid bis(p-tert-butoxyphenyl) phenylsulfonium, trifluoromethanesulfonic acid bis(p-tert-butoxyphenyl)(p-methylphenyl)sulfonium, trifluoromethanesulfonic acid bis(p-tert-butoxyphenyl)(m-methylphenyl)sulfonium, trifluoromethanesulfonic acid bis(p-tert-butoxyphenyl)(o-methylphenyl)sulfonium, trifluoromethanesulfonic acid bis(p-tert-butoxyphenyl)(p-methoxyphenyl)sulfonium, trifluoromethanesulfonic acid bis(p-tert-butoxyphenyl)(m-methoxyphenyl)sulfonium, trifluoromethanesulfonic acid bis(p-tert-butoxyphenyl)(o-methoxyphenyl)sulfonium, trifluoromethanesulfonic acid tris(p-tert-butoxyphenyl) sulfonium, etc.

Also included are p-toluenesulfonic acid bis(p-tert-butoxyphenyl) phenylsulfonium, p-toluenesulfonic acid bis(p-tert-butoxyphenyl)(p-methylphenyl)sulfonium, p-toluenesulfonic acid bis(p-tert-butoxyphenyl)(m-methylphenyl)sulfonium, p-toluenesulfonic acid bis(p-tert-butoxyphenyl)(o-methylphenyl)sulfonium, p-toluenesulfonic acid bis(p-tert-butoxyphenyl)(p-methoxyphenyl)sulfonium, p-toluenesulfonic acid bis(p-tert-butoxyphenyl)(m-methoxyphenyl)sulfonium, p-toluenesulfonic acid bis(p-tert-butoxyphenyl)(o-methoxyphenyl)sulfonium, p-toluenesulfonic acid tris(p-tert-butoxyphenyl)sulfonium, etc.

The sulfonium salts may be used alone or in admixture of two or more.

The sulfonium salt of formula (1) can be synthesized by reacting bis(p,tert-butoxyphenyl)sulfoxide of formula (3) with a trimethylsilylsulfonate compound of formula (4) and then with an aryl Grignard reagent of formula (5) prepared in an organic solvent such as tetrahydrofuran (THF) according to the following reaction scheme.

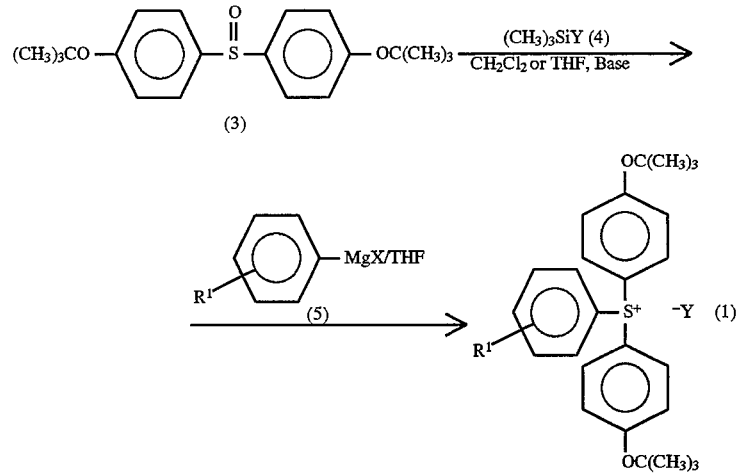

In the formulae, X is chlorine or bromine, $R^1$ and Y are as defined above.

This reaction is preferably carried out in anorganic solvent such as methylene chloride and THF. In the first stage of reacting bis(p-tert-butoxyphenyl)sulfoxide of formula (3) with a trimethylsilylsulfonate compound of formula (4), the trimethylsilylsulfonate is desirably added dropwise in an amount of about 1 to 2 mol per mol of the sulfoxide compound of formula (3), more desirably in the presence of a base such as triethylamine and pyridine. Preferred reaction conditions include a temperature of about –78° C. to room temperature and a time of about 10 to 60 minutes.

In the second stage of reacting the intermediate with an aryl Grignard reagent of formula (5) prepared in an organic solvent such as THF, the aryl Grignard reagent is desirably added dropwise in an amount of about 1 to 3 mol per mol of the sulfoxide compound of formula (3) at a temperature of about –78° C. to room temperature. The reaction solution is preferably aged at a temperature of about −10° C. to about 40° C. for about ½ to 2 hours. At the end of reaction, the solvent layer is washed with water and concentrated. The end sulfonium salt of formula (1) can be recovered by recrystallization or column fractionation.

Examples of photo-acid generator (E) include onium salts, oxime sulfonic acid derivatives, 2,6-dinitrobenzylsulfonic acid derivatives, diazonaphthoquinone sulfonate derivatives, 2,4-bistrichloromethyl-6-aryl-1,3,5-triazine derivatives, and α,α'-bisarylsulfonyl diazomethane derivatives. Preferred are onium salts of the following general formula (2):

$$(R^2)_n MY \qquad (2)$$

wherein $R^2$ is independently selected from substituted or unsubstituted aromatic groups, M is sulfonium or iodonium, Y is p-toluenesulfonate or trifluoromethanesulfonate, and letter n is equal to 2 or 3. Exemplary aromatic groups represented by $R^2$ are a phenyl group and phenyl groups having an alkyl or alkoxy substituent as described in formula (1).

Illustrative examples of the onium salt are given by the following iodonium and sulfonium salts.

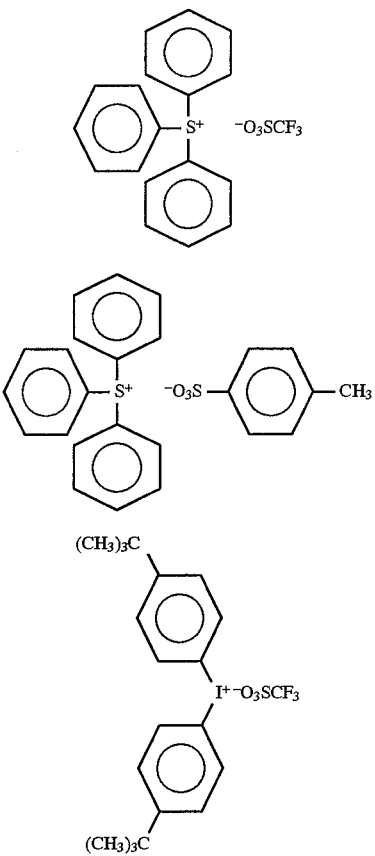

Nitrogenous compounds (F) include amine and amide compounds having a boiling point of 150° C. or higher. Examples include aniline, N-methylaniline, N,N-dimethylaniline, o-toluidine, m-toluidine, p-toluidine, 2,4-lutidine, quinoline, isoquinoline, formamide, N-methylformamide, N,N-dimethylformamide, acetamide, N-methylacetamide, N,N-dimethylacetamide, 2-pyrrolidone, N-methylpyrrolidone, imidazole, α-picoline, β-picoline, δ-picoline, o-aminobenzoic acid, m-aminobenzoic acid, p-aminobenzoic acid, 1,2-phenylenediamine, 1,3-phenylenediamine, 1,4-phenylenediamine, 2-quinolinecarboxylic acid, 2-amino-4-nitrophenol, and triazines such as 2-(p-chlorophenyl)-4,6-trichloromethyl-s-triazine. Preferred among others are pyrrolidone, N-methylpyrrolidone, o-, m- and p-aminobenzoic acid, 1,2-, 1,3- and 1,4-phenylenediamine.

The resist composition of the invention may further contain a surfactant for improving coating properties and a light absorbing substance for reducing the influence of irregular reflection from the substrate.

With respect to the use of the resist composition of the invention and light exposure, any of well-known lithography techniques may be used. The resist composition of the invention is best suited for fine patterning using deep UV light of 254 to 193 nm and electron beams.

There has been described a resist composition containing a sulfonium salt of formula (1) and a nitrogenous compound which is sensitive to high energy rays such as deep UV, electron and X-rays, especially KrF excimer laser beams as a positive resist material, can be patterned by development with alkaline aqueous solution, and has high sensitivity, resolution and resistance to plasma etching with the resulting resist pattern having improved heat resistance.

EXAMPLE

Examples of the present invention are given below by way of illustration and not by way of limitation.

Examples 1–12 & Comparative Examples 1–7

Liquid resist compositions were prepared by dissolving a polyhydroxystyrene derivative of the following formula Polym. 1 wherein some OH groups are protected by t-butoxycarbonyl groups, an photo-acid generator selected from the onium salts of the formulae PAG. 1 to PAG. 6, a dissolution inhibitor of the formula DRI.1 or DRI.2, and a nitrogenous compound, in diethylene glycol dimethyl ether (diglyme) in accordance with the formulation shown in Table 1.

Each of the compositions was passed through a 0.2-μm Teflon® filter. It was then spin coated onto a silicon wafer to form a coating of 0.8 μm thick. With the silicon wafer rested on a hot plate at 100° C., the coating was prebaked for 120 seconds.

The film was exposed to a pattern of light by means of an excimer laser stepper model NSR 2005EX (manufactured by Nikon K.K., numerical aperture NA=0.5), baked at 90° C. for 60 seconds, and developed with an aqueous solution of 2.38% tetramethylammonium hydroxide, obtaining a positive pattern.

The resulting resist pattern was evaluated as follows.

First, sensitivity (Eth value) was determined. Provided that the exposure quantity with which the top and bottom of a 0.35-μm line-and-space pattern were resolved at 1:1 was the optimum exposure (sensitivity Eop), the minimum line width of a line-and-space pattern which was recognized separate at this exposure was the resolution of a test resist. The configuration of the resist pattern resolved was observed under a scanning electron microscope. The resist was determined for PED stability by exposing at the optimum exposure, leaving the resist film to stand for a varying time, and baking the film. The delay time was determined at which a change in the resist pattern configuration was observed, for example, the line pattern was T-top configured or resolution became impossible. The longer the delay time, the better is the PED stability.

The results are shown in Table 1.
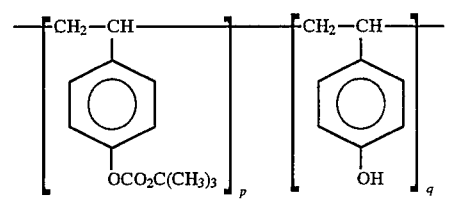 Polym.1
p/(p + q) = 0.1~0.3
Mw = 10,000~50,000
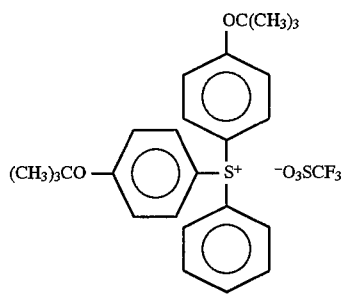 PAG.1
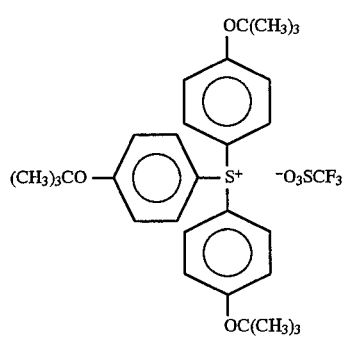 PAG.2
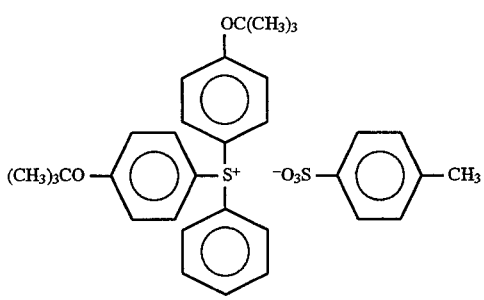 PAG.3
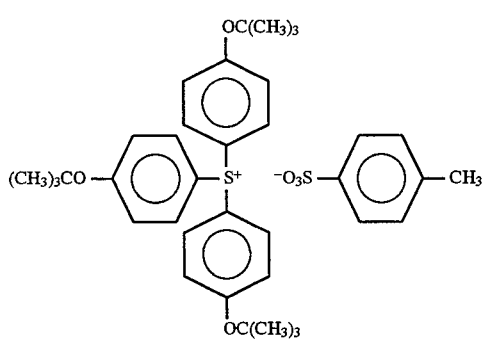 PAG.4
-continued
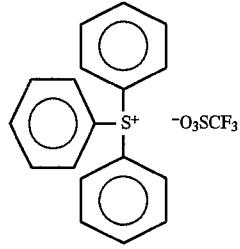 PAG.5
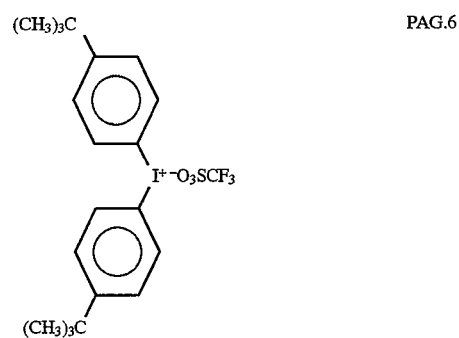 PAG.6
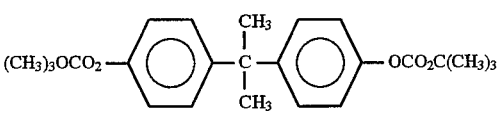 DRI.1
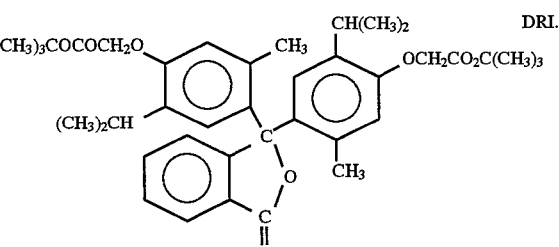 DRI.2

TABLE 1

| Example | Alkali soluble resin | Acid generator | Dissolution inhibitor | Nitrogenous compound | Solvent | Sensitivity Eop (mJ/cm$^2$) | Resolution (μm) | Pattern profile | PED stability (min.) |
|---|---|---|---|---|---|---|---|---|---|
| E1 | Polym.1 (80) | PAG.1 (5) | DRI.1 (14) | NMP (0.4) | diglyme (300) | 24.0 | 0.22 | rectangular | ≧120 |
| E2 | Polym.1 (80) | PAG.2 (5) | DRI.1 (14) | NMP (0.4) | diglyme (300) | 27.0 | 0.22 | rectangular | ≧120 |
| E3 | Polym.1 (80) | PAG.3 (3) | DRI.1 (14) | NMP (0.4) | diglyme (300) | 39.0 | 0.22 | rectangular | ≧120 |
| E4 | Polym.1 (80) | PAG.4 (3) | DRI.1 (14) | NMP (0.4) | diglyme (300) | 42.0 | 0.22 | rectangular | ≧120 |
| E5 | Polym.1 (80) | PAG.1 (5) | DRI.2 (14) | NMP (0.4) | diglyme (300) | 27.0 | 0.22 | rectangular | ≧120 |
| E6 | Polym.1 (80) | PAG.2 (5) | DRI.2 (14) | NMP (0.4) | diglyme (300) | 31.0 | 0.22 | rectangular | ≧120 |
| E7 | Polym.1 (80) | PAG.3 (3) | DRI.2 (14) | NMP (0.4) | diglyme (300) | 45.0 | 0.22 | rectangular | ≧120 |
| E8 | Polym.1 (80) | PAG.4 (3) | DRI.2 (14) | NMP (0.4) | diglyme (300) | 48.0 | 0.22 | rectangular | ≧120 |
| E9 | Polym.1 (80) | PAG.1(3) PAG.5(2) | DRI.1 (14) | NMP (0.4) | diglyme (300) | 23.0 | 0.25 | rectangular | ≧120 |
| E10 | Polym.1 (80) | PAG.2(3) PAG.6(2) | DRI.1 (14) | NMP (0.4) | diglyme (300) | 25.0 | 0.25 | rectangular | ≧120 |
| E11 | Polym.1 (80) | PAG.1 (6) | — | NMP (0.4) | diglyme (300) | 24.0 | 0.26 | rectangular | ≧120 |
| E12 | Polym.1 (80) | PAG.1(4) PAG.5(2) | — | NMP (0.4) | diglyme (300) | 22.0 | 0.28 | rectangular | ≧120 |
| CE1 | Polym.1 (80) | PAG.1 (5) | DRI.1 (14) | — | diglyme (300) | 4.0 | 0.22 | rectangular | 15–30 |
| CE2 | Polym.1 (80) | PAG.2 (5) | DRI.2 (14) | — | diglyme (300) | 5.5 | 0.22 | rectangular | 15–30 |
| CE3 | Polym.1 (80) | PAG.3 (3) | DRI.1 (14) | — | diglyme (300) | 12.0 | 0.22 | rectangular | 30–70 |
| CE4 | Polym.1 (80) | PAG.4 (3) | DRI.2 (14) | — | diglyme (300) | 15.0 | 0.22 | rectangular | 30–70 |
| CE5 | Polym.1 (80) | PAG.1(3) PAG.5(2) | DRI.1 (14) | — | diglyme (300) | 4.5 | 0.25 | rectangular | 15–30 |
| CE6 | Polym.1 (80) | PAG.1 (6) | — | — | diglyme (300) | 4.0 | 0.26 | rectangular | 15–30 |
| CE7 | Polym.1 (80) | PAG.1(4) PAG.5(2) | — | — | diglyme (300) | 3.5 | 0.28 | rectangular | 15–30 |

*NMP: N-methylpyrrolidone

Examples 13–24

Positive patterns were formed by the same procedure as in Examples 1–12 except that 0.3 part of p-aminobenzoic acid was used instead of N-methylpyrrolidone as the nitrogenous compound. The resist patterns were similarly evaluated to find equivalent results.

Examples 25–36

Positive patterns were formed by the same procedure as in Examples 1–12 except that 0.2 part of 1,4-phenylenediamine was used instead of N-methylpyrrolidone as the nitrogenous compound. The resist patterns were similarly evaluated to find equivalent results.

Synthesis of PAG. 1 to PAG. 4 is described for the sake of reference.

Synthesis Example 1

Synthesis of trifluoromethanesulfonic acid bis(p-tert-butoxyphenyl)phenylsulfonium A solution of 40.0 g (0.12 mol) of bis(p-tert-butoxyphenyl)sulfoxide and 6.0 g (0.060 mol) of triethylamine in 400 g of methylene chloride was cooled to –70° C. with a dry ice methanol bath. With stirring, 28.4 g (0.13 mol) of (trimethylsilyl)trifluoromethanesulfonate, simply referred to as trimethylsilyltriflate, was added dropwise to the solution while controlling the temperature so as not to exceed –60° C.

Thereafter, the dry ice methanol bath was replaced by an ice water bath whereupon the reaction solution was stirred for 10 minutes at a reaction temperature of 0 to 5° C.

The reaction solution was cooled again to –70° C. with a dry ice methanol bath. A Grignard reagent which was prepared from 5.6 g (0.23 mol) of metallic magnesium, 60 g of THF and 26.0 g (0.23 mol) of chlorobenzene in a conventional manner was added dropwise to the solution while controlling the temperature so as not to exceed –60° C.

Thereafter, the dry ice methanol bath was replaced by an ice water bath whereupon the reaction solution was stirred for a further 60 minutes at a reaction temperature of 0° to 5° C., completing the reaction.

Water was added dropwise to the reaction solution to decompose the excess of Grignard reagent and the resulting inorganic salt was removed by filtration. The filtrate was washed three times with 520 g of water. The organic layer was evaporated in vacuo, obtaining an oily product. By recrystallization from the oily product, trifluoromethanesulfonic acid bis(p-tert-butoxyphenyl)phenylsulfonium was isolated in an amount of 16.8 g (yield a purity of 99%, and a melting point of 94°–96° C.

The end product was analyzed by NMR, IR spectrometry, and elemental analysis, with the results shown below. Proton NMR: CDCl$_3$, δ(ppm)

[Structure: (CH$_3$)$_3$CO-(a) phenyl(b,c)-S$^+$ -O$_3$SCF$_3$, with OC(CH$_3$)$_3$(a) on top phenyl and phenyl(d,e,f) below]

| (a) | 1.45 | singlet | 18H |
|---|---|---|---|
| (b) | 7.19–7.23 | doublet | 4H |
| (c)–(f) | 7.58–7.61 | multiplet | 9H |

IR: (cm$^-$) 3066, 2981, 2937, 2875, 1585, 1489, 1446, 1396, 1371, 1309, 1265, 1223, 1157, 1072, 1030, 999, 928, 893, 839

Elemental analysis (%) for C$_{27}$H$_{31}$F$_3$O$_5$S$_2$ Calcd. C: 58.3 H: 5.6 FoundC: 58.2 H: 5.6

Synthesis Example 2

Synthesis of trifluoromethanesulfonic acid tris(p-tert-butoxyphenyl)sulfonium

With stirring and cooling on the cold bath, 37.8 g (0.17 mol) of trimethylsilyltriflate was added dropwise to a solution of 30.0 g (0.087 mol) of bis(p-tert-butoxyphenyl)sulfoxide and 13.4 g (0.17 mol) of pyridine in 200 g of THF while controlling the temperature so as not to exceed 0° C. The reaction solution was then stirred for 10 minutes at a reaction temperature of 0° to 5° C.

A Grignard reagent which was prepared from 4.2 g (0.17 mol) of metallic magnesium, 50 g of THF and 34.3 g (0.19 mol) of p-tert-butoxyphenyl chloride in a conventional manner was added dropwise to the reaction solution while controlling the temperature so as not to exceed 0° C. The reaction solution was then stirred for a further 60 minutes at a reaction temperature of 0° to 5° C., completing the reaction.

Water was added dropwise to the reaction solution to decompose the excess of Grignard reagent and the resulting inorganic salt was removed by filtration. To the filtrate, 600 g of methylene chloride, 300 g of saturated ammonium chloride aqueous solution and 400 g of water were added for separation. After layer separation, the organic layer was washed twice with 400 g of water. The organic layer was evaporated in vacuo, obtaining an oily product. By recrystallization from the oily product, trifluoromethane-sulfonic acid tris(p-tert-butoxyphenyl)sulfonium was isolated in an amount of 27.3 g (yield 50%), a purity of 99%, and a melting point of 150°–152° C.

The end product was analyzed by NMR, IR spectrometry, and elemental analysis, with the results shown below.

Proton NMR: CDCl$_3$, δ(ppm)

[Structure: (CH$_3$)$_3$CO-(a) with two OC(CH$_3$)$_3$(a) substituted phenyl(b,c) groups attached to S$^+$ -O$_3$SCF$_3$]

| (a) | 1.42 | singlet | 27H |
|---|---|---|---|
| (b) | 7.17–7.20 | doublet | 6H |
| (c) | 7.55–7.59 | doublet | 6H |

IR: (cm$^-$) 2980, 2937, 2875, 1585, 1490, 1417, 1396, 1371, 1309, 1269, 1267, 1223, 1159, 1076, 1030, 930, 908, 904, 839

Elemental analysis (%) for C$_{31}$H$_{39}$F$_3$O$_6$S$_2$ Calcd. C: 59.2 H: 6.2 FoundC: 59.4 H: 6.4

Synthesis Example 3

Synthesis of p-toluenesulfonic acid bis(p-tert-butoxyphenyl)phenylsulfonium

With stirring and cooling on the cold bath, 24.4.g (0.1 mol) of (trimethylsilyl)-p-toluenesulfonate was added dropwise to a solution of 17.3 g (0.05 mol) of bis(p-tert-butoxyphenyl)sulfoxide and 10.1 g (0.1 mol) of triethylamine in 150 g of THF while controlling the temperature so as not to exceed 0° C. Thereafter, the reaction solution was stirred for 30 minutes at a reaction temperature of 0° to 5° C.

A Grignard reagent which was prepared from 2.4 g (0.1 mol) of metallic magnesium, 27 g of THF and 11.3 g (0.1 mol) of chlorobenzene in a conventional manner was added dropwise to the reaction solution while controlling the temperature so as not to exceed 0° C. Thereafter, the reaction solution was stirred for a further 60 minutes at a reaction temperature of 0° to 5° C. completing the reaction Water was added dropwise to the reaction solution to decompose the excess of Grignard reagent and the resulting inorganic salt was removed by filtration. To the filtrate were added 1000 g of methylene chloride and 700 g of saturated ammonium chloride aqueous solution. After layer separation, the organic layer was washed three times with 1000 g of water. The organic layer was evaporated in vacuo, obtaining an oily product. The oily product was worked up by silica gel column chromatography, isolating p-toluene-sulfonic acid bis(p-tert-butoxyphenyl)phenylsulfonium in an amount of 8.8 g (yield 30%) and a purity of 98%.

The end product was analyzed by NMR, IR spectrometry, and elemental analysis, with the results shown below.

Proton NMR: CDCl$_3$, δ(ppm)

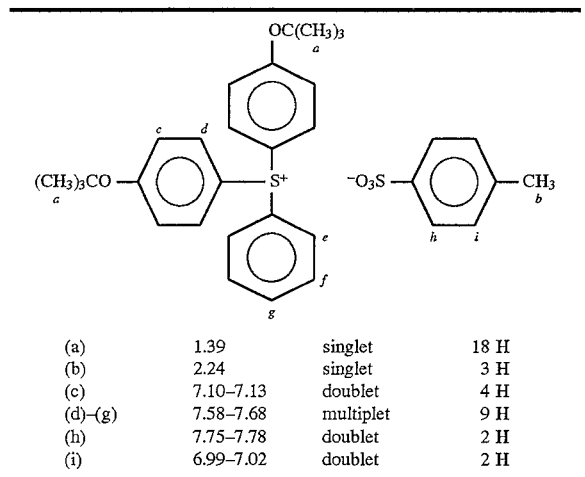

| (a) | 1.39 | singlet | 18 H |
|---|---|---|---|
| (b) | 2.24 | singlet | 3 H |
| (c) | 7.10–7.13 | doublet | 4 H |
| (d)–(g) | 7.58–7.68 | multiplet | 9 H |
| (h) | 7.75–7.78 | doublet | 2 H |
| (i) | 6.99–7.02 | doublet | 2 H |

IR: (cm$^{-1}$) 3059, 2978, 2933, 1583, 1489, 1446, 1396, 1308, 1265, 1203, 1201, 1159, 1119, 1072, 1034, 1012, 928, 895, 843, 816

Elemental analysis (%) for C$_{33}$H$_{22}$O$_5$S$_2$ Calcd. C: 68.5 H: 6.6 foundC: 68.3 H: 6.4

Synthesis Example 4

Synthesis of p-toluenesulfonic acid tris(p-tert-butoxyphenyl)sulfonium

With stirring and cooling on the cold bath, 14.2 g (0.058 mol) of (trimethylsilyl)-p-toluenesulfonate was added dropwise to a solution of 10.0 g (0.029 mol) of bis(p-tert-butoxyphenyl)sulfoxide and 5.8 g (0.058 mol) of triethylamine in 115 g of THF while controlling the temperature so as not to exceed 0° C. Thereafter, the reaction solution was stirred for 30 minutes at a reaction temperature of 0 to 5° C.

A Grignard reagent which was prepared from 1.4 g (0.058 mol) of metallic magnesium, 16 g of THF and 11.8 g (0.064 mol) of p-tert-butoxyphenyl chloride in a conventional manner was added dropwise to the reaction solution while controlling the temperature so as not to exceed 0° C. Thereafter, the reaction solution was stirred for a further 60 minutes at a reaction temperature of 0° to 5° C., completing the reaction.

Water was added dropwise to the reaction solution to decompose the excess of Grignard reagent and the resulting inorganic salt was removed by filtration. To the filtrate were added 600 g of methylene chloride, 200 g of saturated ammonium chloride aqueous solution and 200 g of water. After layer separation, the organic layer was washed three times with 500 g of water. The organic layer was evaporated in vacuo, obtaining an oily product. By recrystallization from the oily product, p-toluenesulfonic acid tris(p-tert-butoxyphenyl)sulfonium was isolated in an amount of 5.2 g (yield 28%), a purity of 99%, a melting point of 178°–181° C.

The end product was analyzed by NMR, IR spectrometry, and elemental analysis, with the results shown below.

Proton NMR: CDCl$_3$, δ(ppm)

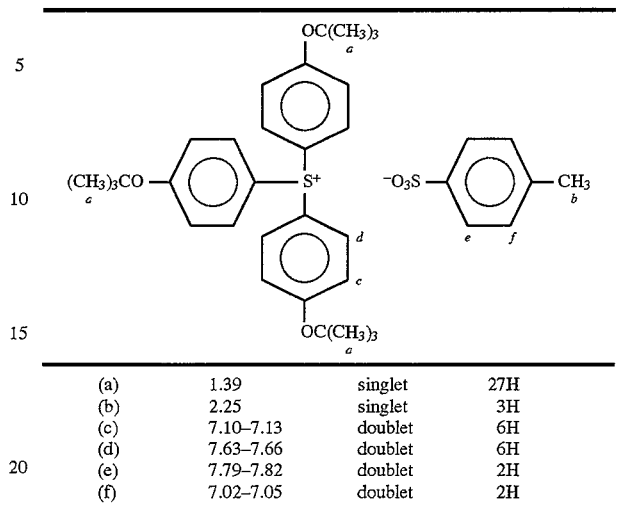

| (a) | 1.39 | singlet | 27H |
|---|---|---|---|
| (b) | 2.25 | singlet | 3H |
| (c) | 7.10–7.13 | doublet | 6H |
| (d) | 7.63–7.66 | doublet | 6H |
| (e) | 7.79–7.82 | doublet | 2H |
| (f) | 7.02–7.05 | doublet | 2H |

IR: (cm$^-$) 2978, 1583, 1489, 1369, 1307, 1263, 1261, 1217, 1200, 1159, 1120, 1074, 1034, 1012, 903, 897, 845, 816

Elemental analysis (%) for C$_{37}$H$_{45}$O$_6$S$_2$ Calcd. C: 68.3 H: 7.1 FoundC: 68.2 H: 7.0

Japanese Patent Application No. 152655/1994 is incorporated herein by reference.

Although some preferred embodiments have been described, many modifications and variations may be made thereto in the light of the above teachings. It is therefore to be understood that within the scope of the appended claims, the invention may be practiced otherwise than as specifically described.

We claim:

1. In a chemically amplified, positive resist composition, the improvement wherein said composition contains at least one nitrogenous compound and at least one sulfonium salt of formula (1):

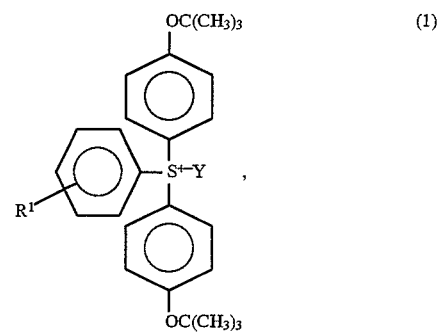

(1)

wherein

R$^1$ is hydrogen, alkyl, or alkoxy and

Y is trifluoromethanesulfonate or p-toluenesulfonate, wherein said at least one nitrogenous compound minimizes the influence of deactivation of an acid generated from said at least one sulfonium salt at the resist surface by basic compounds within air; and wherein said at least one nitrogenous compound is aniline, N-methylaniline, N,N-dimethylaniline, o-toluidine, m-toluidine, p-toluidine, 2,4-lutidine, quinoline, isoquinoline, formamide, N-methylformamide, N,N-dimethylformamide, acetamide, N-methylacetamide, N,N- dimethylacetamide, 2-pyrrolidone, N-methylpyrrolidone, imidazole, α-picoline, β-picoline, τ-picoline, o-aminobenzoic acid, m-aminobenzoic acid, p-aminobenzoic acid, 1,2-phenylenediamine, 1,3-phenylenediamine, 1,4-phenylenediamine, 2-quinolinecarboxylic acid, 2-amino-4-nitrophenol or 2-(p-chlorophenyl)-4,6-trichloromethyl-s-triazine.

2. A composition according to claim 1, wherein $R^1$ is hydrogen, alkyl having 1–8 C atoms or alkoxy having 1–8 C atoms; and Y is trifluoromethanesulfonate or p-toluenesulfonate.

3. A composition according to claim 2, wherein $R^1$ is hydrogen, alkyl having 1–8 C atoms, methoxy or ethoxy.

4. A composition according to claim 1, wherein said sulfonium salt of formula (1) is:

trifluoromethanesulfonic acid bis(p-tert-butoxyphenyl)phenylsulfonium, trifluoromethanesulfonic acid bis(p-tert-butoxyphenyl)(p-methylphenyl)sulfonium, trifluoromethanesulfonic acid bis(p-tert-butoxyphenyl)(m-methylphenyl)sulfonium, trifluoromethanesulfonic acid bis(p-tert-butoxyphenyl)(o-methylphenyl)sulfonium, trifluoromethanesulfonic acid bis(p-tert-butoxyphenyl)(p-methoxyphenyl)sulfonium, trifluoromethanesulfonic acid bis(p-tert-butoxyphenyl)(m-methoxyphenyl)sulfonium, trifluoromethanesulfonic acid bis(p-tert-butoxyphenyl)(o-methoxyphenyl)sulfonium, trifluoromethanesulfonic acid tris(p-tert-butoxyphenyl)sulfonium, p-toluenesulfonic acid bis(p-tert-butoxyphenyl)phenylsulfonium, p-toluenesulfonic acid bis(p-tert-butoxyphenyl)(p-methylphenyl)sulfonium, p-toluenesulfonic acid bis(p-tert-butoxyphenyl)(m-methylphenyl)sulfonium, p-toluenesulfonic acid bis(p-tert-butoxyphenyl)(o-methylphenyl)sulfonium, p-toluenesulfonic acid bis(p-tert-butoxyphenyl)(p-methoxyphenyl)sulfonium, p-toluenesulfonic acid bis(p-tert-butoxyphenyl)(m-methoxyphenyl)sulfonium, p-toluenesulfonic acid bis(p-tert-butoxyphenyl)(o-methoxyphenyl)sulfonium, or p-toluenesulfonic acid tris(p-tert-butoxyphenyl)sulfonium.

5. A composition according to claim 1, wherein said nitrogenous compound is N,N-dimethylformamide, N,N-dimethylacetamide, 2-pyrrolidone, N-methylpyrrolidone, o-aminobenzoic acid, m-aminobenzoic acid, p-aminobenzoic acid, 1,2-phenylenediamine, 1,3-phenylenediamine or 1,4-phenylene diamine.

6. A composition according to claim 1, wherein said composition contains said nitrogenous compound and said sulfonium salt in a ratio of 1–15 parts: 0.05–4 parts.

7. A composition according to claim 1, wherein said composition contains said nitrogenous compound and said sulfonium salt in a ratio of 2–8 parts: 0.1–1 part.

8. A chemically amplified, positive resist composition comprising:

(A) an organic solvent, (B) an alkali soluble resin, (D) a sulfonium salt of formula (1)

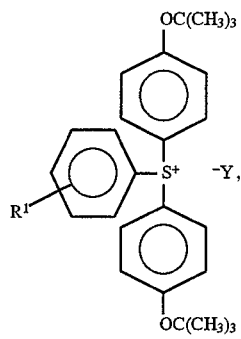

wherein $R^1$ is hydrogen, alkyl or alkoxy, and

Y is trifluoromethanesulfonate or p-toluenesulfonate; and (F) a nitrogenous compound;

wherein said at least one nitrogenous compound minimizes the influence of deactivation of an acid generated from said at least one sulfonium salt at the resist surface by basic compounds within air; and wherein said nitrogenous compound is aniline, N-methylaniline, N,N-dimethylaniline, o-toluidine, m-toluidine, p-toluidine, 2,4-lutidine, quinoline, isoquinoline, formamide, N-methylformamide, N,N-dimethylformamide, acetamide, N-methylacetamide, N,N-dimethylacetamide, 2-pyrrolidone, N-methylpyrrolidone, imidazole, α-picoline, β-picoline, τ-picoline, o-aminobenzoic acid, m-aminobenzoic acid, p-aminobenzoic acid, 1,2-phenylenediamine, 1,3-phenylenediamine, 1,4-phenylenediamine, 2-quinolinecarboxylic acid, 2-amino-4-nitrophenol or 2-(p-chlorophenyl)-4,6-trichloromethyl-s-triazine.

9. A composition of claim 8, wherein said alkali soluble resin (B) is a polyhydroxystyrene in which hydrogen atoms of some hydroxyl groups are replaced by acid unstable groups and which has a weight average molecular weight of 5,000–100,000.

10. A composition of claim 8, wherein said nitrogenous compound (F) is 2-pyrrolidone, N-methylpyrrolidone, o-aminobenzoic acid, m-aminobenzoic acid, p-aminobenzoic acid, 1,2-phenylenediamine, 1,3-phenylene diamine, or 1,4-phenylenediamine.

11. A chemically amplified, positive resist composition according to claim 8, further comprising:

(C) a dissolution inhibitor having an acid unstable group, and (E) a photo-acid generator.

12. A composition according to claim 11, wherein said composition comprises 150–700 parts of said organic solvent, 70–90 parts of said alkali-soluble resin, 5–40 parts of said dissolution inhibitor having an acid unstable group, 1–15 parts of said sulfonium salt, 0.5–15 parts of said photo-acid generator, and 0.05–4 parts of said nitrogenous compound.

13. A composition according to claim 11, wherein said composition comprises 250–500 parts of said organic solvent, 75–85 parts of said alkali-soluble resin, 10–25 parts of said dissolution inhibitor having an acid unstable group, 2–8 parts of said sulfonium salt, 2–8 parts of said photo-acid generator, and 0.1–1 parts of said nitrogenous compound.

14. A chemically amplified, positive resist composition according to claim 8, further comprising:

(C) a dissolution inhibitor having an acid unstable group, and (E) an onium salt of formula (2):

$$(R^2)_n MY \quad (2),$$

wherein
R$^2$ is independently selected from substituted or unsubstituted aromatic groups,
M is sulfonium or iodonium,
Y is trifluoromethanesulfonate or p-toluenesulfonate, and
is 2 or 3.

15. A composition according to claim 14, wherein R$^2$ is phenyl, phenyl substituted by alkyl having 1–8 C atoms, or phenyl substituted by alkoxy having 1–8 C atoms.

16. A chemically amplified, positive resist composition according to claim 8, further comprising:

(C) a dissolution inhibitor having an acid unstable group.

17. A composition according to claim 16, wherein said dissolution inhibitor is

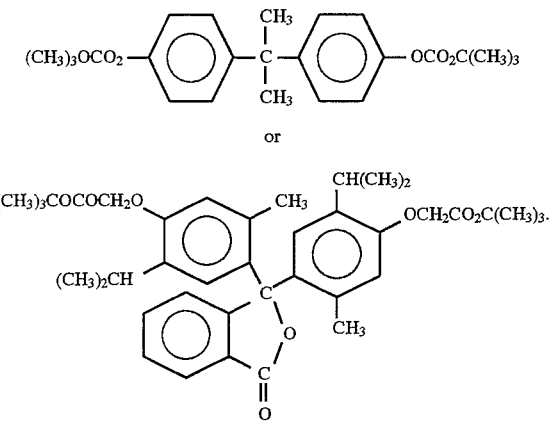

or

18. A chemically amplified, positive resist composition according to claim 8, further comprising:

(E) a photo-acid generator.

19. A composition according to claim 8, wherein R$^1$ is hydrogen, alkyl having 1–8 C atoms or alkoxy having 1–8 C atoms; and Y is trifluoromethanesulfonate or p-toluenesulfonate.

20. A composition according to claim 8, wherein said sulfonium salt of formula (1) is:

trifluoromethanesulfonic acid bis(p-tert-butoxyphenyl) phenylsulfonium, trifluoromethanesulfonic acid bis(p-tert-butoxyphenyl)(p-methylphenyl)sulfonium, trifluoromethanesulfonic acid bis(p-tert-butoxyphenyl)(m-methylphenyl)sulfonium, trifluoromethanesulfonic acid bis(p-tert-butoxyphenyl)(o-methylphenyl)sulfonium, trifluoromethanesulfonic acid bis(p-tert-butoxyphenyl)(p-methoxyphenyl)sulfonium, trifluoromethanesulfonic acid bis(p-tert-butoxyphenyl)(m-methoxyphenyl)sulfonium, trifluoromethanesulfonic acid bis (p-tert-butoxyphenyl)(o-methoxyphenyl)sulfonium, trifluoromethanesulfonic acid tris (p-tert-butoxyphenyl) sulfonium, p-toluenesulfonic acid bis(p-tert-butoxyphenyl) phenylsulfonium, p-toluenesulfonic acid bis(p-tert-butoxyphenyl)(p-methylphenyl)sulfonium, p-toluenesulfonic acid bis(p-tert-butoxyphenyl)(m-methylphenyl)sulfonium, p-toluenesulfonic acid bis(p-tert-butoxyphenyl)(o-methylphenyl)sulfonium, p-toluenesulfonic acid bis(p-tert-butoxyphenyl)(p-methoxyphenyl)sulfonium, p-toluenesulfonic acid bis(p-tert-butoxyphenyl)(m-methoxyphenyl)sulfonium, p-toluenesulfonic acid bis(p-tert-butoxyphenyl)(o-methoxyphenyl)sulfonium, or p-toluenesulfonic acid tris(p-tert-butoxyphenyl) sulfonium.

21. A composition according to claim 8, wherein said composition contains said nitrogenous compound and said sulfonium salt in a ratio of 1–15 parts: 0.05–4 parts.

22. A composition according to claim 8, wherein said composition contains said nitrogenous compound and said sulfonium salt in a ratio of 2–8 parts: 0.1–1 part.

* * * * *